United States Patent
Soda

(10) Patent No.: US 10,026,762 B2
(45) Date of Patent: Jul. 17, 2018

(54) IMAGE PICKUP DEVICE HAVING AN ARRANGEMENT OF LINES THAT DOES NOT HINDER REALIZATION OF AN INCREASED READ RATE

(71) Applicant: CANON KABUSHIKI KAISHA, Tokyo (JP)

(72) Inventor: Takehiko Soda, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 110 days.

(21) Appl. No.: 15/080,385

(22) Filed: Mar. 24, 2016

(65) Prior Publication Data

US 2016/0293648 A1 Oct. 6, 2016

(30) Foreign Application Priority Data

Mar. 31, 2015 (JP) ................. 2015-074499

(51) Int. Cl.
| | | |
|---|---|---|
| *H04N 5/225* | (2006.01) | |
| *H01L 27/146* | (2006.01) | |
| *H04N 5/374* | (2011.01) | |
| *H04N 9/04* | (2006.01) | |

(52) U.S. Cl.
CPC .. *H01L 27/14612* (2013.01); *H01L 27/14603* (2013.01); *H01L 27/14643* (2013.01); *H04N 5/3742* (2013.01); *H04N 9/045* (2013.01); *H01L 27/14627* (2013.01)

(58) Field of Classification Search
None
See application file for complete search history.

(56) References Cited

U.S. PATENT DOCUMENTS

| | | | | |
|---|---|---|---|---|
| 2001/0010272 A1* | 8/2001 | Otsuka | ................... | H05K 1/024 174/258 |
| 2002/0195678 A1* | 12/2002 | Watanabe | .............. | B82Y 10/00 257/440 |
| 2003/0189224 A1* | 10/2003 | Ohsaki | .................. | H01L 23/528 257/211 |
| 2004/0079970 A1* | 4/2004 | Hosono | .................. | G11C 5/063 257/210 |
| 2004/0262765 A1* | 12/2004 | Burton | ................ | H01L 23/5222 257/758 |
| 2010/0013967 A1* | 1/2010 | Tanaka | .............. | H01L 27/14683 348/273 |
| 2012/0126422 A1* | 5/2012 | Endo | ................... | H01L 23/5286 257/774 |
| 2013/0182484 A1* | 7/2013 | Chong | ................... | G11C 5/063 365/63 |
| 2014/0001639 A1* | 1/2014 | Hiraishi | .................. | H01L 23/48 257/773 |
| 2014/0015600 A1* | 1/2014 | Sato | .................... | H01L 31/0224 327/538 |

FOREIGN PATENT DOCUMENTS

JP 2006-050403 A 2/2006

* cited by examiner

*Primary Examiner* — Twyler L Haskins
*Assistant Examiner* — Dwight Alex C Tejano
(74) *Attorney, Agent, or Firm* — Canon U.S.A., Inc. IP Division

(57) ABSTRACT

A first signal line, a second signal line, a first line, and a second line are disposed in an identical direction on an identical layer. A distance between the first signal line and the second signal line is larger than a distance between the first signal line and the first line or larger than a distance between the second signal line and the second line.

15 Claims, 13 Drawing Sheets

|    | H1 | H2 | H3 | H4 |   |
|----|----|----|----|----|---|
| L1 | GR | RD | GR | RD |   |
| L2 | BL | GB | BL | GB |   |
| L3 | GR | RD | GR | RD |   |
| L4 | BL | GB | BL | GB |   |
|    |    |    |    |    |   |

IMAGE PICKUP DEVICE HAVING AN ARRANGEMENT OF LINES THAT DOES NOT HINDER REALIZATION OF AN INCREASED READ RATE

BACKGROUND OF THE INVENTION

Field of the Invention

The present invention relates to an arrangement of lines in an image pickup device.

Description of the Related Art

Japanese Patent Laid-Open No. 2006-50403 discloses a solid-state image pickup element for use in digital camcorders and digital still cameras. The solid-state image pickup element includes a plurality of signal lines for each column. This configuration allows signals to be simultaneously read from a plurality of rows and consequently increases the read rate. Japanese Patent Laid-Open No. 2006-50403 discloses a configuration where distances between the plurality of signal lines are equal.

However, when distances between a plurality of signal lines are equal as in Japanese Patent Laid-Open No. 2006-50403, such a configuration may hinder realization of an increased read rate.

SUMMARY OF THE INVENTION

Accordingly, the present invention provides an image pickup device that has an arrangement of lines that does not hinder realization of an increased read rate.

An image pickup device according to an aspect of the present invention includes a photoelectric converter, an amplifier, and a first wiring layer. The amplifier is configured to output a pixel signal, which is based on signal charge accumulated in the photoelectric converter, to a first signal line and a second signal line different from the first signal line. On the first wiring layer, the first signal line, the second signal line, a first line different from the first signal line and the second signal line, and a second line different from the first signal line, the second signal line, and the first line are disposed in an identical direction. The first signal line is disposed between the first line and the second signal line in plan view and the second signal line is disposed between the first signal line and the second line in plan view. A distance between the first signal line and the second signal line is larger than a distance between the first signal line and the first line or larger than a distance between the second signal line and the second line.

Further features of the present invention will become apparent from the following description of exemplary embodiments with reference to the attached drawings.

DESCRIPTION OF THE EMBODIMENTS

First Embodiment

An example of a complementary metal oxide semiconductor (CMOS) image pickup device will be described below as a first embodiment.

Figure 1:
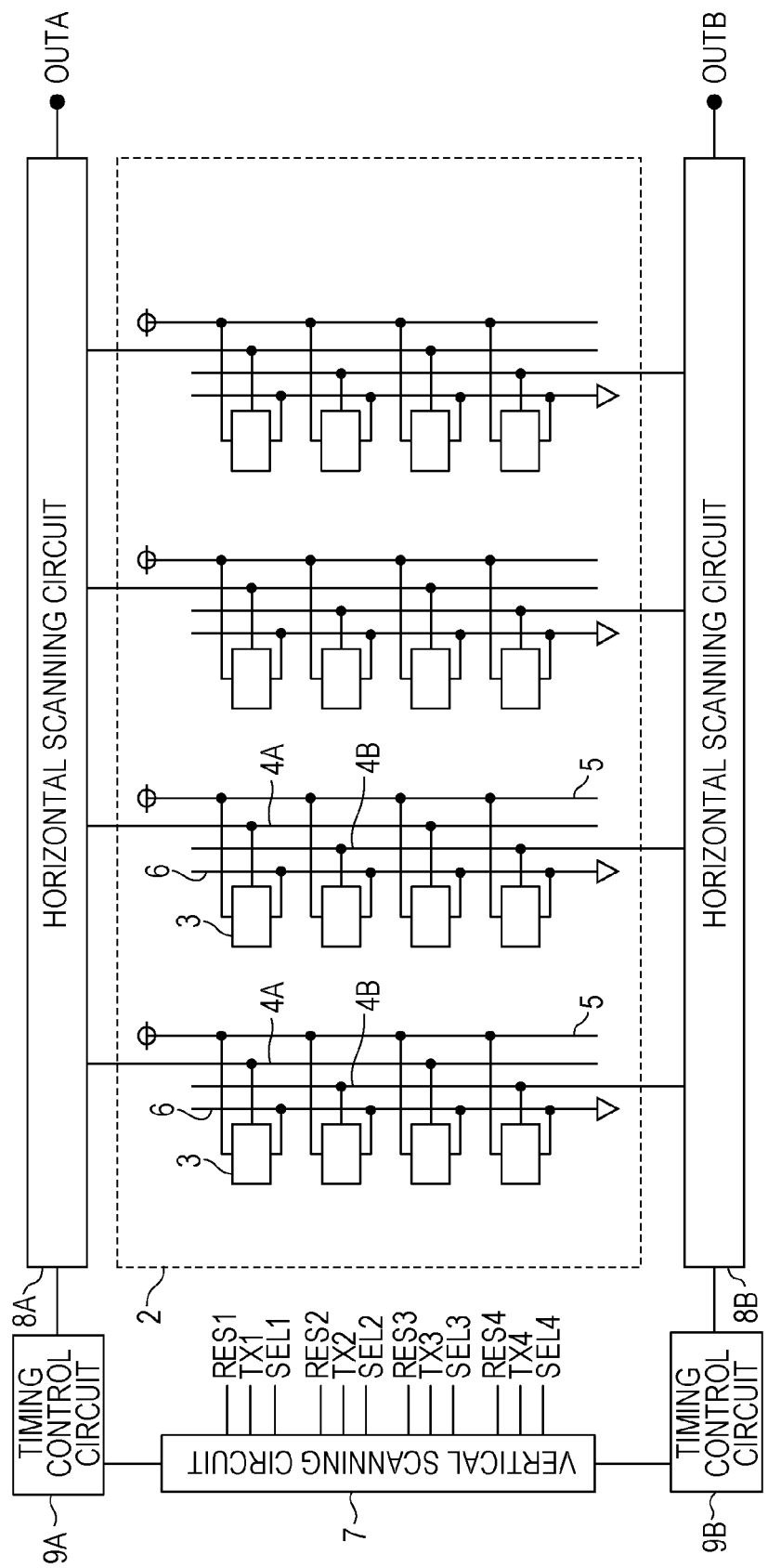
FIG. 1 is a schematic block diagram according to a first embodiment.

FIG. 1 is a block diagram illustrating a configuration of the image pickup device. The image pickup device includes a pixel portion 2, which includes a plurality of pixels 3 arranged in a matrix. For ease of explanation, FIG. 1 illustrates an example of the pixels 3 arranged in four rows and four columns.

The image pickup device includes horizontal scanning circuits 8A and 8B, and first column signal lines 4A (first signal lines) and second column signal lines 4B (second signal lines) that transfer information of pixel signals read from the pixel portion 2 to the horizontal scanning circuits 8A and 8B, respectively.

In FIG. 1, pixel signals of the pixels 3 on odd-numbered rows (first and third rows) of the pixel portion 2 are output to the corresponding first column signal lines 4A. Pixel signals of the pixels 3 on even-numbered rows (second and fourth rows) of the pixel portion 2 are output to the corresponding second column signal lines 4B.

The image pickup device also includes power-supply lines 5, each for a corresponding column of the pixel portion 2, and power-supply lines 6, each for a corresponding column of the pixel portion 2. For example, each of the power-supply lines 5 serves as a drain-side power supply (VDD), whereas each of the power-supply lines 6 serves as a ground power supply (GND). The image pickup device further includes timing control circuits 9A and 9B. The timing control circuit 9A outputs a control signal to the horizontal scanning circuit 8A to control a timing at which a pixel signal is processed. Likewise, the timing control circuit 9B outputs a control signal to the horizontal scanning circuit 8B.

The image pickup device also includes a vertical scanning circuit 7. The vertical scanning circuit 7 outputs a set of control signals for reading a pixel signal (such as a set of RES1, TX1, and SEL1) to the pixels 3 on each row of the pixel portion 2. In FIG. 1, an illustration of lines indicating connections of the control signals (such as RES1, TX1, and SEL1) to the pixel portion 2 is omitted. The horizontal scanning circuits 8A and 8B each include a noise-reduction circuit, an amplifier circuit, and analog-digital (A/D) converter circuit, for example. With the above-described configuration, information of pixel signals output from the pixel portion 2 are read via the horizontal scanning circuits 8A and 8B.

Figure 2:
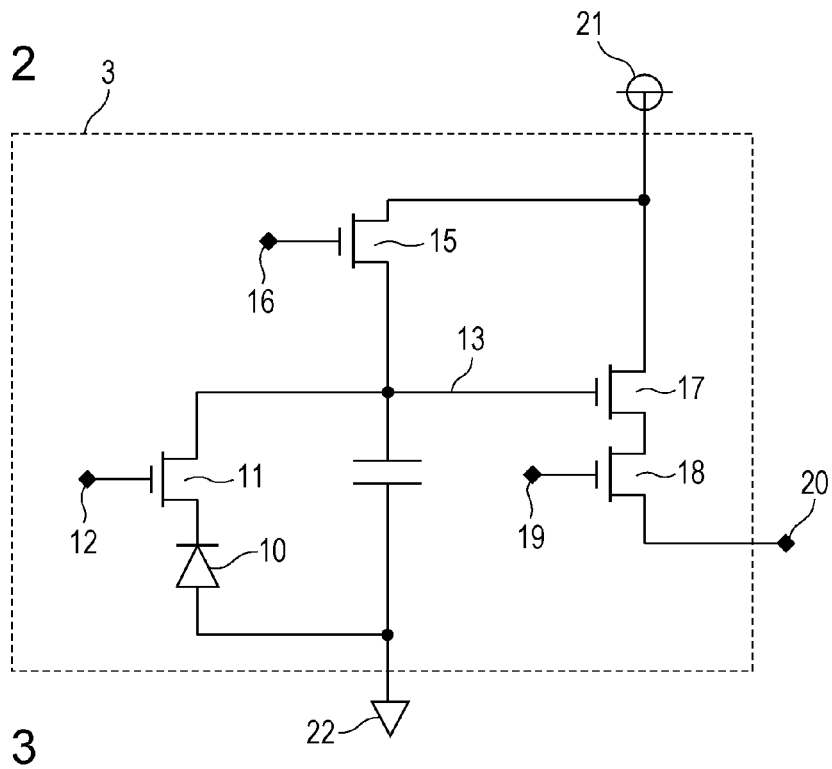
FIG. 2 is a diagram illustrating circuitry of a pixel according to the first embodiment.

FIG. 2 is an equivalent circuit diagram of the pixel 3. The pixel 3 includes a photoelectric converter 10 (photodiode, for example), a transfer transistor 11, a floating diffusion 13, a reset transistor 15, a source-follower transistor 17 serving as an amplifier, and a selection transistor 18. The selection transistor 18 is sometimes omitted.

The pixel 3 has a power-supply terminal 21, which is connected to VDD equivalent to the power-supply line 5, and a power-supply terminal 22, which is connected to GND equivalent to the power-supply line 6.

The transfer transistor 11 has a gate 12, which is supplied with the control signal TX1. When the control signal TX1 is active, electric charge generated by and accumulated in the photoelectric converter 10 in response to incidence of light is transferred to the floating diffusion 13 by the transfer transistor 11.

A voltage output by the source-follower transistor 17 may change depending on a change in potential of a node, which is caused by the electric charge transferred to the floating diffusion 13.

The selection transistor 18 has a gate 19, which is supplied with the control signal SEM. When the control signal SELL is active, the selection transistor 18 outputs, to an output terminal 20 of the pixel 3, the pixel signal that has been output from the source-follower transistor 17.

As illustrated in FIG. 1, the output terminal 20 is connected to the first column signal line 4A or the second column signal line 4B. That is, the source-follower transistor 17 serving as an amplifier outputs a pixel signal that is based on signal charge accumulated in the photoelectric converter 10 to a corresponding one of the first column signal line 4A and the second column signal line 4B via the output terminal 20. The reset transistor 15 has a gate 16, which is supplied with the control signal RES1. When the control signal RES1 is active, the reset transistor 15 resets the potential of the floating diffusion 13. As illustrated in FIG. 1, the pixels 3 each having a configuration illustrated in the equivalent circuit diagram in FIG. 2 are arranged in a matrix. Accordingly, a first amplifier (the source-follower transistor 17) of pixels 3 on an m-th row outputs a pixel signal to the first column signal line 4A, whereas a second amplifier (the source-follower transistor 17) of pixels 3 on an (m+1)-th row outputs a pixel signal to the second column signal line 4B.

In the first embodiment, a signal output from the output terminal 20 is an analog signal; however, a digital signal may be output from each of the pixels 3 by including a digital output unit in the pixel 3.

Figure 3:
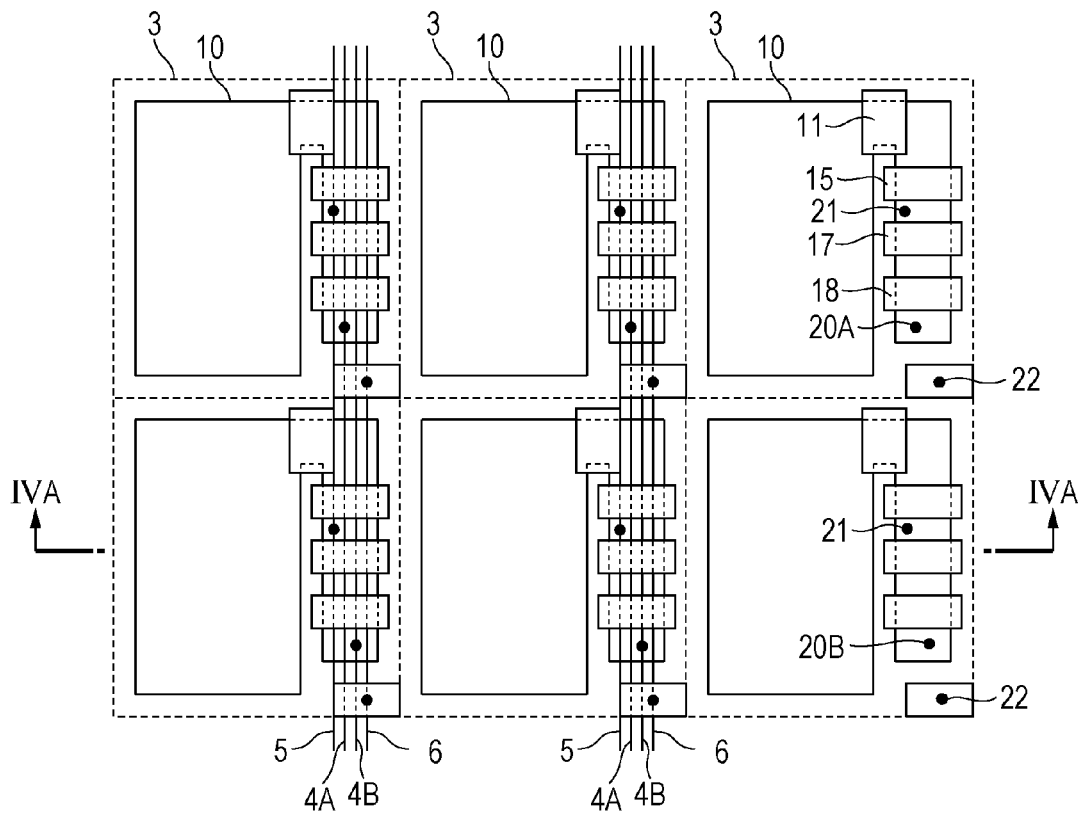
FIG. 3 is a diagram illustrating a pixel array according to the first embodiment.

FIG. 3 is a schematic plan view illustrating the pixels 3 arranged in two rows and three columns in the pixel portion 2. For ease of view, an illustration of lines for the sets of control signals (such as a set of REST, TX1, and SEL1) are omitted. In addition, an illustration of the first column signal line 4A, the second column signal line 4B, the power-supply line 5, and the power-supply line 6 is omitted for the pixels 3 on the third column. As illustrated in FIG. 3, patterns each including a plurality of lines are periodically disposed in a predetermined direction. A distance between the power-supply line 6 for an n-th column and the power-supply line 5 for an (n+1)-th column is larger than a distance between the power-supply line 6 for the n-th column and the power-supply line 5 for the n-th column.

Figure 4A:
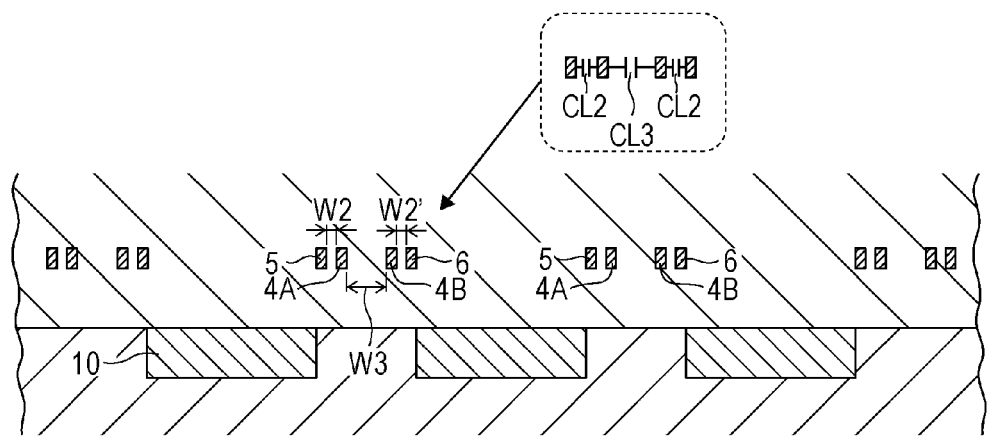
FIGS. 4A and 4B are a sectional view of an image pickup device according to the first embodiment and a sectional view of an image pickup device according to a comparative example, respectively.
Figure 4B:
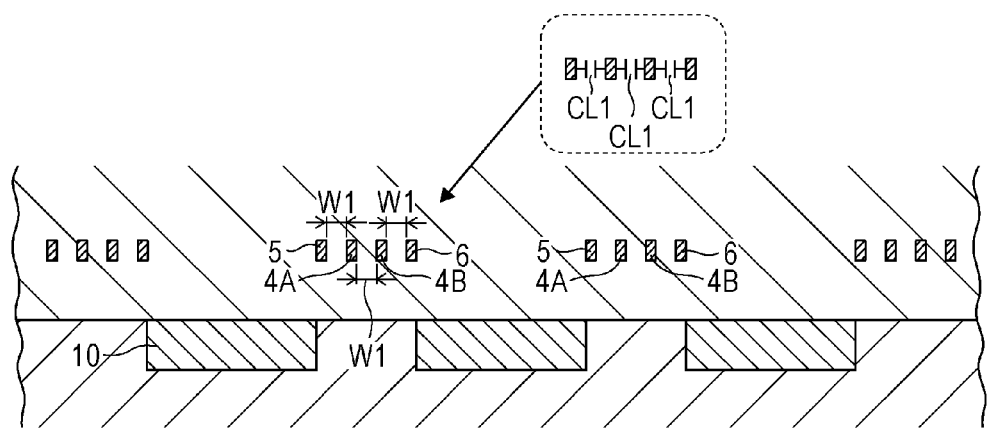

FIG. 4A illustrates the first embodiment and is a schematic diagram of a sectional structure along line IVA-IVA illustrated in the schematic plan view of FIG. 3. For ease of explanation, an illustration of the components other than the lines and the photoelectric converters 10 is omitted. FIG. 4B is a schematic diagram illustrating a sectional structure according to a comparative example.

Referring to FIG. 4B, the first column signal line 4A (first signal line), the second column signal line 4B (second signal line), the power-supply line 5 (first line), and the power-supply line 6 (second line) are disposed in the same direction on the same wiring layer. For example, the first and second column signal lines 4A and 4B and the power-supply lines 5 and 6 are disposed in the column direction on the third wiring layer.

The first column signal line 4A (first signal line) is disposed between the power-supply line 5 (first line) and the power-supply line 6 (second line) in plan view. The second column signal line 4B (second signal line) is disposed between the first column signal line 4A (first signal line) and the power-supply line 6 (second line) in plan view. The power-supply lines 5 and 6 are disposed closer to the corresponding photoelectric converter 10 than to the first column signal line 4A and the second column signal line 4B, respectively. The first column signal line 4A is the sole line adjacent to the power-supply line 5, whereas the second column signal line 4B is the sole line adjacent to the power-supply line 6.

In FIG. 4B, a distance between the first column signal line 4A and the second column signal line 4B, a distance between the power-supply line 5 and the first column signal line 4A, and a distance between the power-supply line 6 and the second column signal line 4B are equal. These distances are denoted by W1 in FIG. 4B.

Parasitic capacitances that may occur between adjacent lines are schematically illustrated in a dotted-line frame in FIG. 4B. FIG. 4B illustrates parasitic capacitances that may occur between horizontally adjacent lines. An illustration of parasitic capacitances that may occur between diagonally adjacent lines and between lines spaced apart by two or more layers is omitted because such parasitic capacitances are relatively small.

Let CL1 denote a parasitic capacitance that may occur between adjacent lines on the same wiring layer. Suppose that a parasitic capacitance between column signal lines is equal to or substantially equal to a parasitic capacitance between one of the column signal lines and a power-supply line. Then, the parasitic capacitance that may occur on each of the first column signal line 4A and the second column signal line 4B is equal to 2×CL1.

In contrast, in the first embodiment illustrated in FIG. 4A, a distance (W3) between the first column signal line 4A and the second column signal line 4B is larger than a distance (W2) between the power-supply line 5 and the first column signal line 4A and larger than a distance (W2') between the power-supply line 6 and the second column signal line 4B. The distances W2 and W2' may be equal or different as long as they are smaller than the distance W3. In the first embodiment, on the wiring layer having disposed thereon a plurality of lines including the first column signal line 4A and the second column signal line 4B, the distance W2 or W2' is set to be the smallest among distances between the plurality of lines.

Parasitic capacitances that may occur between adjacent lines are schematically illustrated in a dotted-line frame in FIG. 4A. Let CL3 denote a parasitic capacitance that may occur between the first column signal line 4A and the second column signal line 4B, and let CL2 denote each of a parasitic capacitance that may occur between the power-supply line 5 and the first column signal line 4A and a parasitic capacitance that may occur between the power-supply line 6 and the second column signal line 4B. Then, the parasitic capacitance that may occur on each of the first column signal line 4A and the second column signal line 4B is equal to CL2+CL3.

Figures 5, 6:
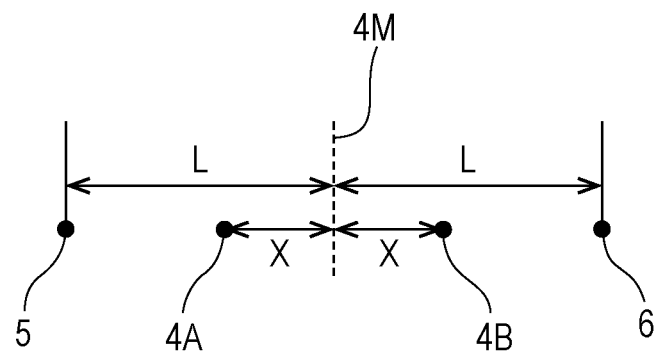
FIG. 5 is a diagram illustrating an arrangement of lines according to the first embodiment.
FIG. 6 is a diagram illustrating a pixel array according to a second embodiment.

FIG. 5 is a schematic diagram of a sectional configuration of the lines illustrated in FIG. 4A. For ease of explanation, each line is denoted as a dot. Let a line 4M be a line that passes the midpoint between a position of the first column signal line 4A and a position of the second column signal line 4B. The first column signal line 4A and the second column signal line 4B are line-symmetrical about the line 4M, and the power-supply lines 5 and 6 are line-symmetrical about the line 4M. Let X denote a distance between the first column signal line 4A and the line 4M, that is, a value obtained by dividing the distance between the first column signal line 4A and the second column signal line 4B by 2, and let L denote a distance between the power-supply line 5 and the line 4M. Then, the parasitic capacitance CL3 that may occur between the first column signal line 4A and the second column signal line 4B is inversely proportional to the distance (2×) between the first column signal line 4A and the second column signal line 4B. In addition, the parasitic capacitance CL2 that may occur between the first column signal line 4A and the power-supply line 5 is inversely proportional to the distance (L−X) between the first column signal line 4A and the power-supply line 5. A result of examination of these relationships between the distance and the parasitic capacitance indicates that the parasitic capacitance that may occur on the first column signal line 4A decreases when the distance X is made larger than a half the distance L. This condition is denoted as Equation 1.

$$\frac{L}{2} < X \qquad \text{(Equation 1)}$$

That is, by setting the distance W3 larger than the distances W2 and W2' as illustrated in FIG. 4A, the parasitic capacitance (CL2+CL3) that may occur on each of the first column signal line 4A and the second column signal line 4B is successfully made smaller than the parasitic capacitance (2×CL1) that may occur on the corresponding one of the first column signal line 4A and the second column signal line 4B in FIG. 4B.

A parasitic capacitance on a signal line to which a pixel signal is output hinders an instantaneous signal-level change on the signal line. Accordingly, it takes a certain period of time for the signal to become stable on the signal line depending on a time constant of the signal line. Such a certain period of time for the signal to become stable is called a stabilization period. A shorter stabilization period enables a smaller amount of delay in transferring the pixel signal and consequently realizes a higher pixel-signal read rate. Accordingly, a small parasitic capacitance on the signal line is desirable.

The configuration described in the first embodiment successfully makes the parasitic capacitance that may occur on each of the first column signal line 4A (first signal line) and the second column signal line 4B (second signal line) smaller than the parasitic capacitance of the case where the first column signal line 4A, the second column signal line 4B, the power-supply line 5, and the power-supply line 6 are disposed at an equal interval. Consequently, such a configuration allows the pixel signal to be read fast and realizes an image pickup device that does not hinder realization of an increased read rate. Note that when the first column signal line 4A is disposed too close to the power-supply line 5, the parasitic capacitance CL2 that may occur between the first column signal line 4A and the power-supply line 5 increases, and consequently the parasitic capacitance (CL2+CL3) that may occur on the first column signal line 4A increases. Accordingly, the first column signal line 4A, the second column signal line 4B, the power-supply line 5, and the power-supply line 6 are desirably arranged to satisfy Equation 2 so that the parasitic capacitance that may occur on each of the first column signal line 4A and the second column signal line 4B is decreased.

$$\frac{L}{2} < X < 2L(\sqrt{2} - 1) - \frac{L}{2} \qquad \text{(Equation 2)}$$

Further, the first column signal line 4A, the second column signal line 4B, the power-supply line 5, and the power-supply line 6 are desirably arranged to satisfy Equation 3 so that the parasitic capacitance that may occur on each of the first column signal line 4A and the second column signal line 4B is decreased.

$$X = L(\sqrt{2} - 1) \qquad \text{(Equation 3)}$$

The parasitic capacitance CL3 that may occur between the first column signal line 4A and the second column signal line 4B in FIG. 4A is smaller than the parasitic capacitance CL1 in FIG. 4B. Accordingly, crosstalk between the first column signal line 4A and the second column signal line 4B may be decreased.

A region in which the relationship (i.e., W3 is larger than W2 and W2') is satisfied need not be the entire region of the pixel portion 2 illustrated in FIG. 1. For example, the relationship may be satisfied in at least 80% of the pixel portion 2.

As described above, because a parasitic capacitance that may occur on each of column signal lines is decreased by increasing a distance between the column signal lines, an amount of delay in transferring an image signal, which is caused by capacitance on the line, is successfully decreased.

When the column signal lines have different parasitic capacitances, the column signal lines have different amounts of transfer delay. Thus, the rate of the subsequent signal processing is limited by the column signal line having a larger amount of transfer delay. However, symmetrical arrangements of the first and second column signal lines 4A and 4B and of the power-supply lines 5 and 6 about the line 4M illustrated in FIG. 5 make parasitic capacitances on the first column signal line 4A and the second column signal line 4B substantially equal. Accordingly, a difference in the amount of delay in transferring the image signal between the even-numbered rows and the odd-numbered rows is successfully decreased.

In the first embodiment, each of the pixels 3 includes one selection transistor 18; however, each of the pixels 3 may include a plurality of selection transistors 18. Such a pixel configuration allows signals of a plurality of rows to be added together by switching between the column signal lines by using the selection transistors 18. For example, each of the pixels 3 may include two selection transistors 18 (first and second selection transistors). In this case, when the first selection transistor is switched on, a pixel signal is output from an amplifier to a first signal line. When the second selection transistor is switched on, the pixel signal is output from the amplifier to the second signal line. In this way, the present invention encompasses the case where a pixel signal is output from one pixel to two signal lines.

In addition, in the first embodiment, a front-side illumination (FSI) structure is used in which light is incident on the front side of a substrate. Accordingly, the first column signal line 4A is the sole line adjacent to the power-supply line 5, the second column signal line 4B is the sole line adjacent to the power-supply line 6, and each of the power-supply lines 5 and 6 is the line that is the closest to the corresponding photoelectric converter 10. Alternatively, a back-side illumination (BSI) structure may be used in which light is incident on the back side of a substrate.

Further, a layered structure may be used in which a photoelectric conversion unit and a peripheral circuit unit or part of a pixel circuit are disposed on different substrates and are electrically connected to each other.

In addition, in the first embodiment, a structure may be used in which each of the pixels 3 includes an A/D converter for converting a voltage signal generated in the pixel 3 into a digital signal and outputs the digital signal to the corresponding column signal line.

Moreover, in the first embodiment, the signal lines are disposed in the column direction of the pixel portion 2; however, the signal lines may be disposed in the row direction of the pixel portion 2. In this case, a first row signal line serves as the first signal line, and a second row signal line serves as the second signal line.

Second Embodiment

An image pickup device according to a second embodiment will be described with reference to FIGS. 6 to 9B. The image pickup device according to the second embodiment has a Bayer color filter illustrated in FIG. 6. A pixel RD (red pixel) detects red light. A pixel BL (blue pixel) detects blue light. A pixel GR or GB (green pixel) detects green light. In addition, columns are denoted by H, and rows are denoted by L.

Figure 7:
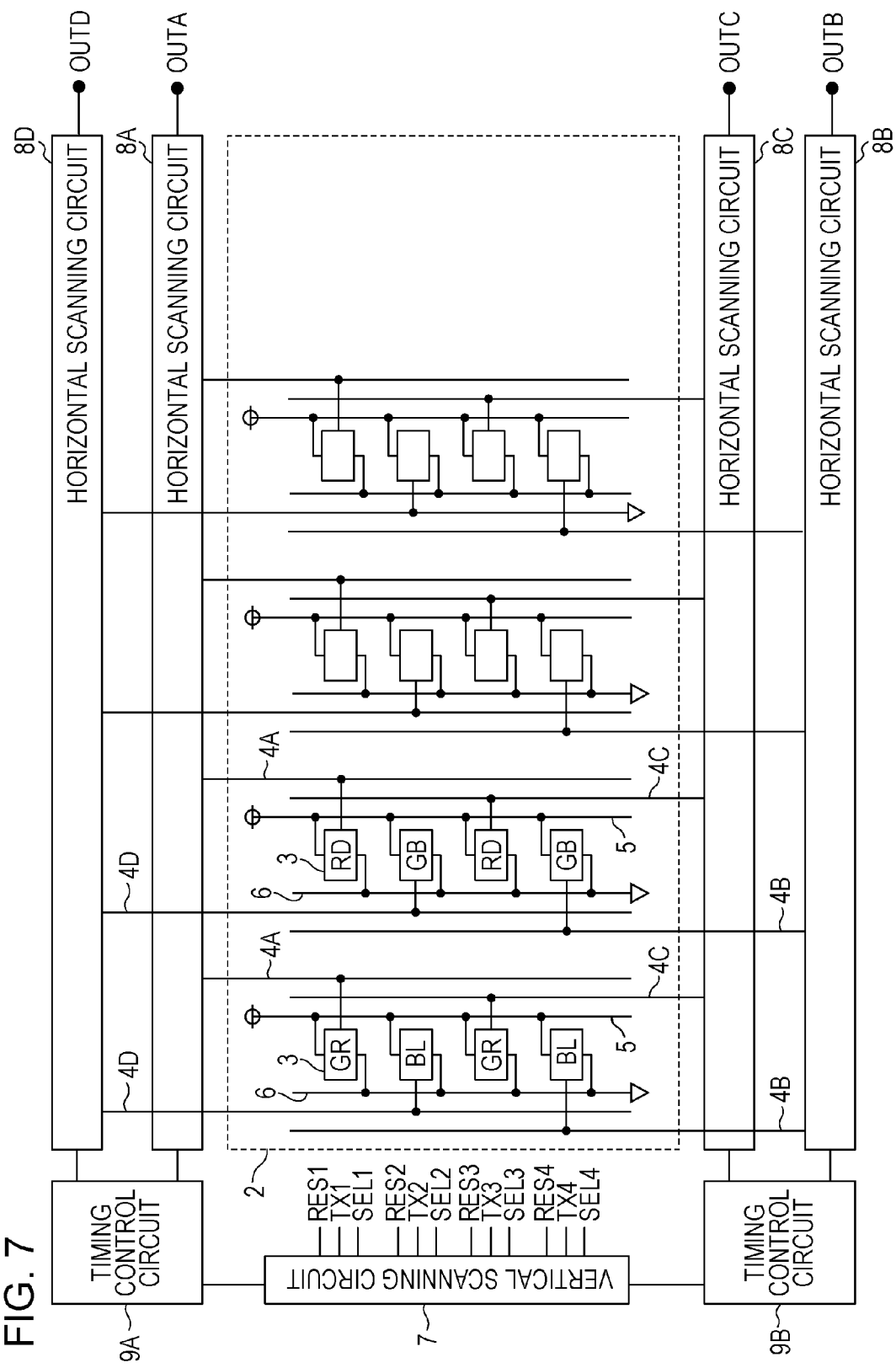
FIG. 7 is a schematic block diagram according to the second embodiment.
Figure 8:
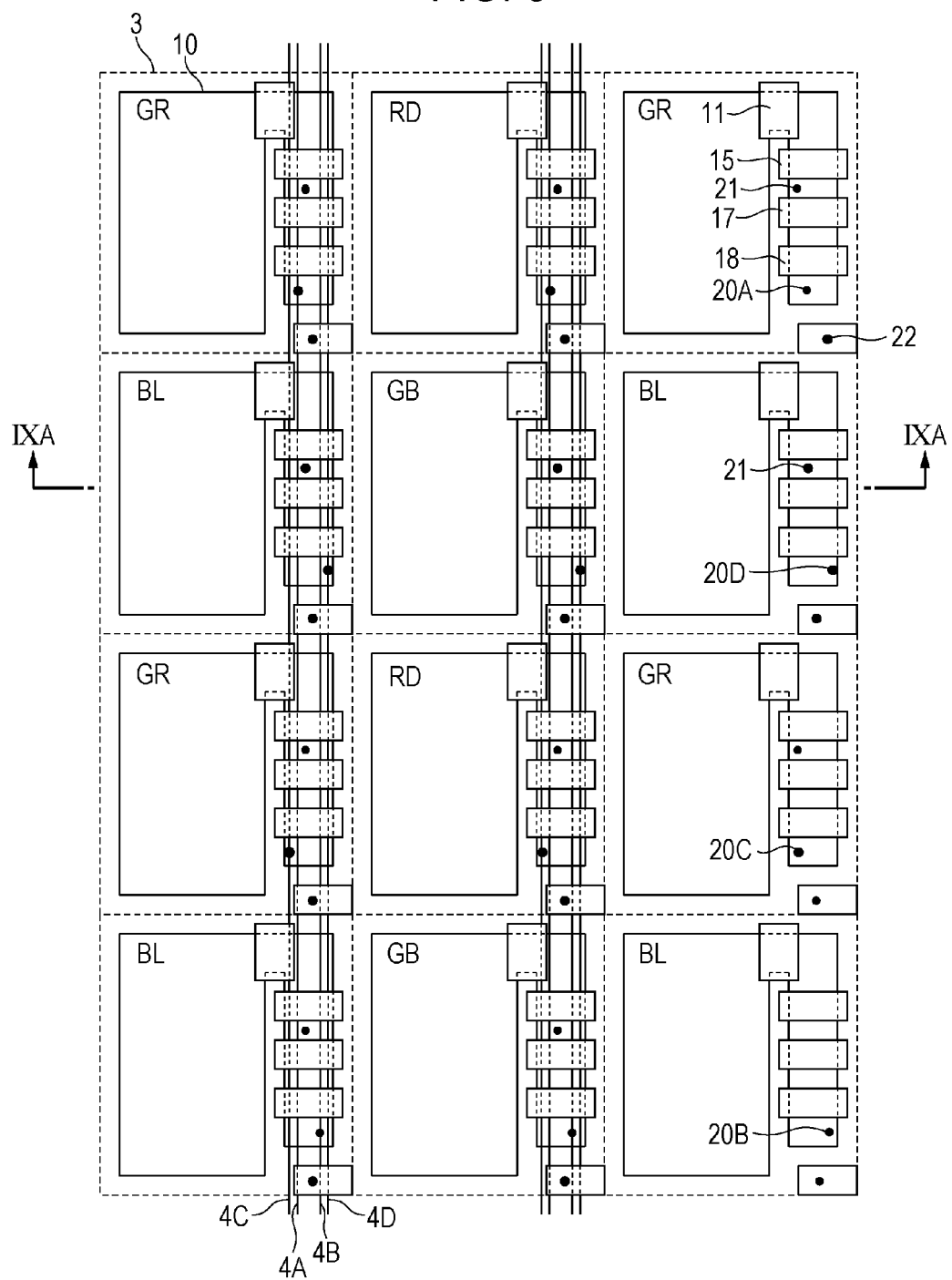
FIG. 8 is a diagram illustrating a portion of the pixel array according to the second embodiment.

FIG. 7 is a block diagram illustrating a configuration of the image pickup device according to the second embodiment. FIG. 8 is a schematic plan view illustrating the pixels 3 arranged in four rows and three columns in the pixel portion 2 of the image pickup device according to the second embodiment.

Referring to FIG. 7, the pixel portion 2 includes the pixels RD that detect red light, the pixels BL that detect blue light, and the pixels GR and GB that detect green light. A signal of each of the pixels 3 is read from the pixel portion 2 and is output to a corresponding one of the first column signal line 4A, the second column signal line 4B, a third column signal line 4C, and a fourth column signal line 4D. For example, pixel signals of the pixels 3 on the odd-numbered rows (first and third rows) of the pixel portion 2 are output to the first column signal line 4A and the third column signal line 4C, respectively. Pixel signals of the pixels 3 on the even-numbered rows (second and fourth rows) are output to the fourth column signal line 4D and the second column signal line 4B, respectively. That is, pixel signals of the pixels GR and RD are connected to the first column signal line 4A or the third column signal line 4C, whereas pixel signals of the pixels GB and BL are connected to the second column signal line 4B or the fourth column signal line 4D.

Figure 9A:
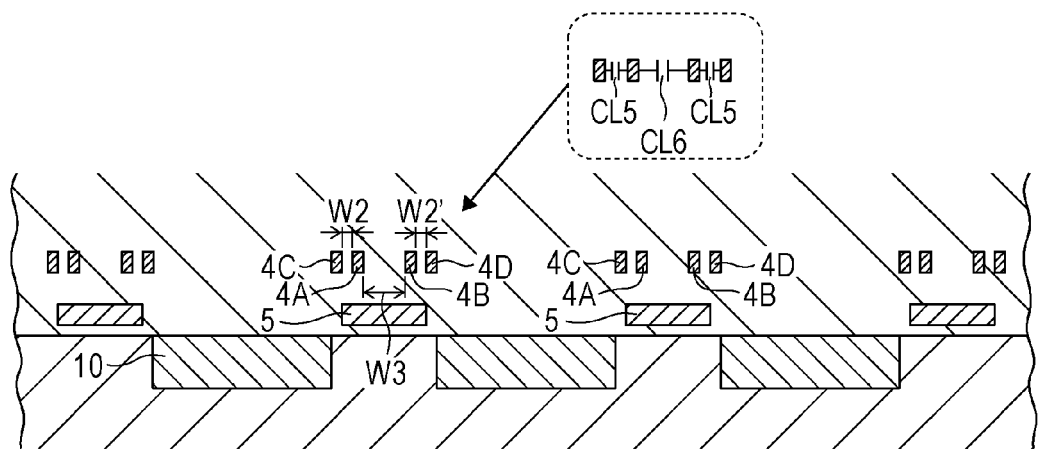
FIGS. 9A and 9B are a sectional view of an image pickup device according to the second embodiment and a sectional view of an image pickup device according to a comparative example, respectively.
Figure 9B:
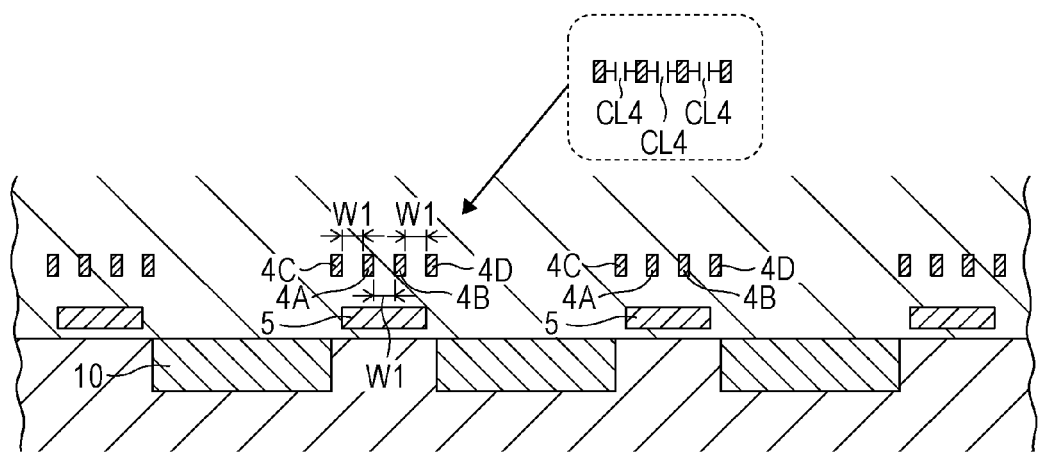

FIG. 9A illustrates the second embodiment and is a schematic diagram illustrating a sectional structure along line IXA-IXA in the schematic plan view of FIG. 8. FIG. 9B is a schematic diagram illustrating a sectional structure according to a comparative example. The first column signal line 4A, the second column signal line 4B, the third column signal line 4C, and the fourth column signal line 4D are disposed in the same direction on the same wiring layer.

Referring to FIG. 9B, a distance between the first column signal line 4A and the second column signal line 4B, a distance between the first column signal line 4A and the third column signal line 4C, a distance between the second column signal line 4B and the fourth column signal line 4D are equal. These distances are denoted by W1 in FIG. 9B.

Let CL4 denote a parasitic capacitance that may occur between adjacent lines on the same wiring layer. Then, a parasitic capacitance that may occur on each of the first column signal line 4A and the second column signal line 4B is equal to 2×CL4, whereas a parasitic capacitance that may occur on each of the third column signal line 4C and the fourth column signal line 4D is equal to CL4. Accordingly, the parasitic capacitance is larger on the first column signal line 4A and the second column signal line 4B than on the third column signal line 4C and the fourth column signal line 4D, which causes a difference in the amount of signal transfer delay. As a result, the rate of the subsequent signal processing is limited by the first column signal line 4A and the second column signal line 4B having a larger amount of delay.

Referring to FIG. 9A, a distance (W3) between the first column signal line 4A and the second column signal line 4B is larger than a distance (W2) between the third column signal line 4C and the first column signal line 4A and larger than a distance (W2') between the second column signal line 4B and the fourth column signal line 4D. The distances W2 and W2' may be equal or different as long as they are smaller than the distance W3. In the second embodiment, on the wiring layer having a plurality of lines including the first column signal line 4A to the fourth column signal line 4D, the distance W2 or W2' is set to be the smallest among distances between the plurality of lines.

Let CL6 denote a parasitic capacitance that may occur between the first column signal line 4A and the second column signal line 4B, and Let CL5 denote each of a parasitic capacitance that may occur between the first column signal line 4A and the third column signal line 4C and a parasitic capacitance that may occur between the second column signal line 4B and the fourth column signal line 4D. Then, a parasitic capacitance that may occur on each of the first column signal line 4A and the second column signal line 4B is equal to CL5+CL6, whereas a parasitic capacitance that may occur on each of the third column signal line 4C and the fourth column signal line 4D is equal to CL5. That is, the parasitic capacitance (CL5+CL6) that may occur on each of the first column signal line 4A and the second column signal line 4B is successfully made smaller than the parasitic capacitance (2×CL4) by making the distance W3 larger than the distance W2 and larger than the distance W2' as illustrated in FIG. 9A.

As the parasitic capacitance decreases on the first column signal line 4A and the second column signal line 4B, the difference between the parasitic capacitance on the first column signal line 4A and the second column signal line 4B and the parasitic capacitance on the third column signal line 4C and the fourth column signal line 4D also decreases.

Consequently, a difference in the amount of signal transfer delay between the first and second column signal lines 4A and 4B and the third and fourth column signal lines 4C and 4D is successfully decreased.

On the first column of the pixel portion 2 illustrated in FIG. 7, the pixel GR on the first row, the pixel BL on the second row, the pixel GR on the third row, and the pixel BL on the fourth row output the pixel signal to the first column signal line 4A, the fourth column signal line 4D, the third column signal line 4C, and the second column signal line 4B, respectively. As a result, column signal lines that transfer signals for an identical color (the first and third column signal lines 4A and 4C, and the second and fourth column signal lines 4B and 4D) are disposed closer to each other than the column signal lines that transfer signals for different colors. Specifically, referring to FIG. 9A, lines that are spaced apart by the distance W3 are column signal lines that transfer signals for different colors, and lines that are spaced apart by the distance W2 or W2' are column signal lines that transfer signals for an identical color. Even if signal crosstalk occurs because the column signal lines are disposed adjacently, such a configuration successfully decreases the influence of color mixing at the column signal lines since the adjacent column signal lines transfer signals for an identical color.

In addition, the first and second column signal lines 4A and 4B may have a resistance different from that of the third and fourth column signal line 4C and 4D. In the case where the column signal lines have different parasitic capacitances, such a difference causes a difference in the amount of signal transfer delay, and consequently the rate of the subsequent signal processing is limited by the column signal line having a larger amount of delay. Accordingly, by decreasing the resistance of the column signal line having a larger amount of delay, the difference in the amount of delay between the column signal lines is successfully decreased, which consequently enables a further increase in the read rate. For example, in the case where the first and second column signal lines 4A and 4B have a larger parasitic capacitance, a width of the first and second column signal lines 4A and 4B is made larger than that of the third and fourth column signal lines 4C and 4D in order to decrease the resistance.

Further, a constant current that flows through the first and second column signal lines 4A and 4B may be set different from a constant current that flows through the third and fourth column signal lines 4C and 4D. The time constant that indicates a period of time taken by the signal on the column signal line to become stable is successfully decreased by increasing the current. Accordingly, by increasing the constant current that flows through the column signal line having a larger amount of delay, a difference in the amount of signal transfer delay between the column signal lines is successfully decreased, which consequently enables a further increase in the read rate. In this case, since the constant current is increased only for some of the column signal lines, additional power consumption may be minimized. For example, in the case where the first and second column signal lines 4A and 4B have a larger parasitic capacitance, a constant current that flows through the first and second column signal lines 4A and 4B is made larger than a constant current that flows through the third and fourth column signal lines 4C and 4D.

Third Embodiment

Figure 10:
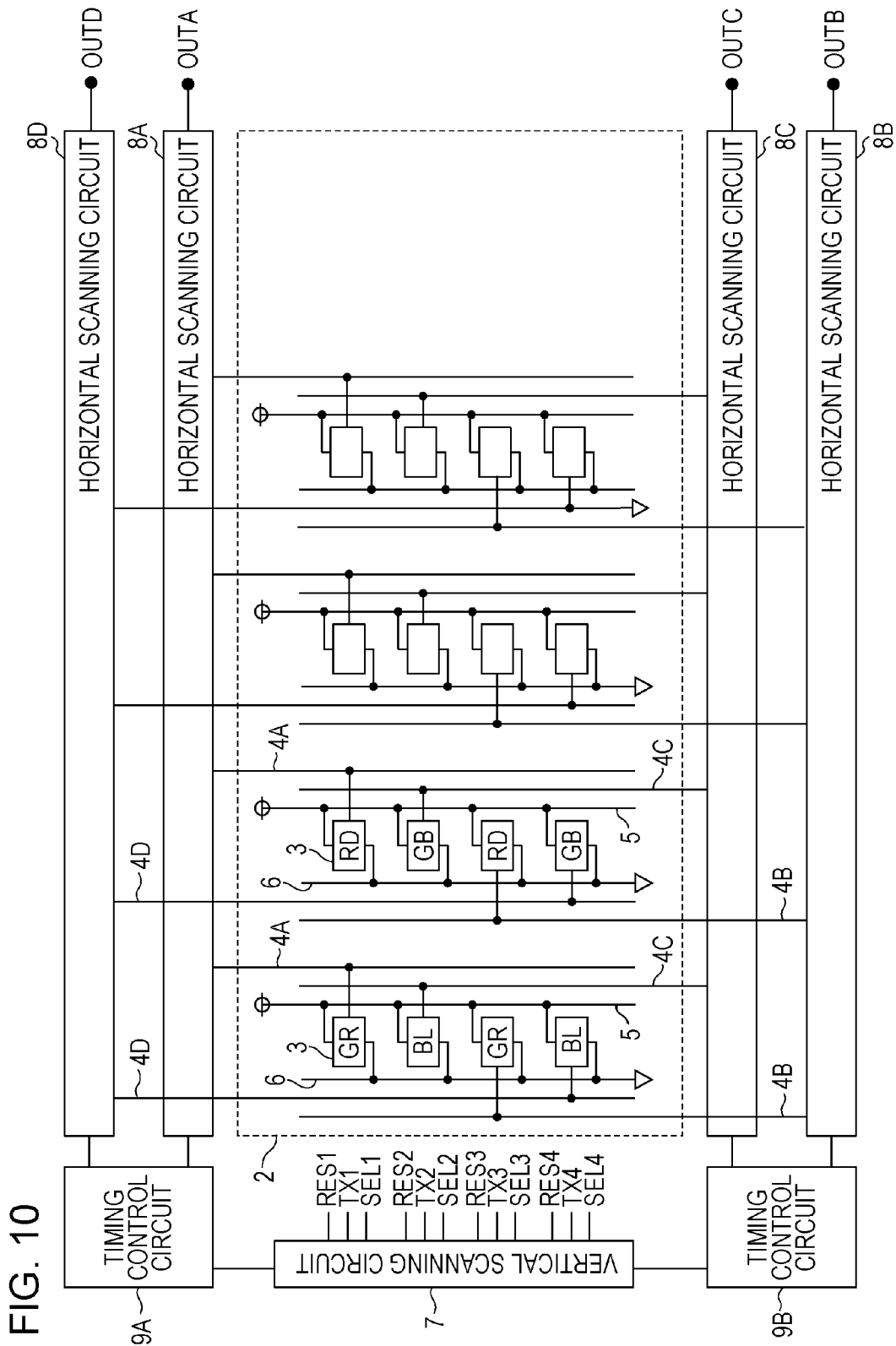
FIG. 10 is a schematic block diagram according to a third embodiment.
Figure 11:
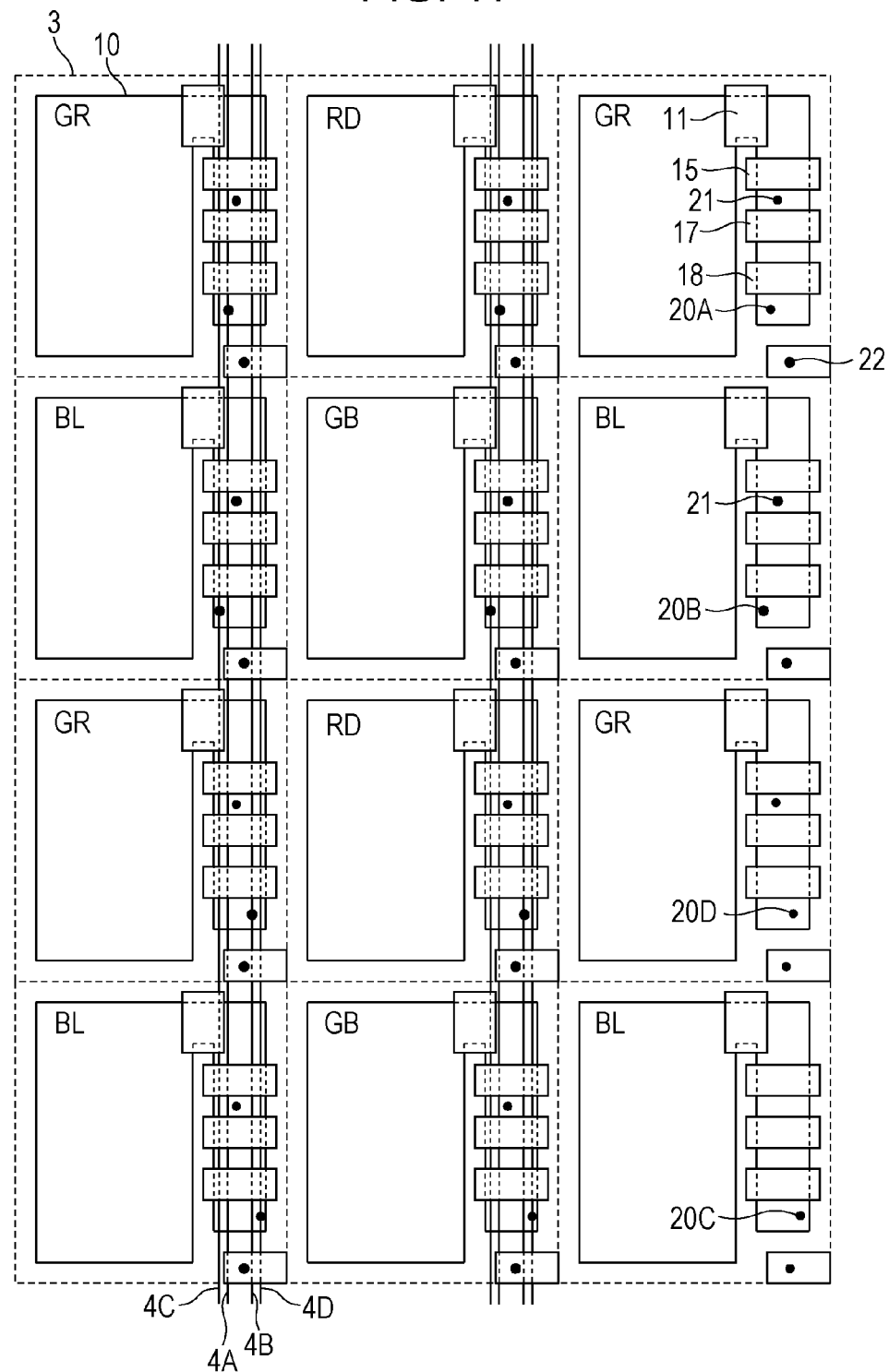
FIG. 11 is a diagram illustrating a pixel array according to the third embodiment.

An image pickup device according to a third embodiment will be described with reference to FIGS. 10 and 11. FIG. 10 is a block diagram illustrating a configuration according to the third embodiment. FIG. 11 is a schematic plan view illustrating the pixels 3 (RD, BL, GR, and GB) arranged in four rows and three columns in the pixel portion 2.

A difference between the third embodiment and the second embodiment is that parasitic capacitances on column signal lines for an identical color are made substantially equal. Specifically, on the first column of the pixel portion 2 illustrated in FIG. 10, the pixel GR on the first row, the pixel BL on the second row, the pixel GR on the third row, and the pixel BL on the fourth row output the pixel signal to the first column signal line 4A, the third column signal line 4C, the second column signal line 4B, and the fourth column signal line 4D, respectively. Accordingly, referring to FIG. 9A, both the column signal lines (the first and second column signal lines 4A and 4B) that transfer signals from the respective pixels GR for an identical color have a parasitic capacitance of CL5+CL6. In addition, both the column signal lines (the third and fourth column signal lines 4C and 4D) that transfer signals from the respective pixels BL for an identical color have a parasitic capacitance of CL5. Since a difference in the parasitic capacitance between the column signal lines for an identical color is decreased, such a configuration successfully equalizes the noise level on the column signal lines for the identical color and successfully enhances the effect of noise processing in the subsequent signal processing.

Fourth Embodiment

Figure 12:
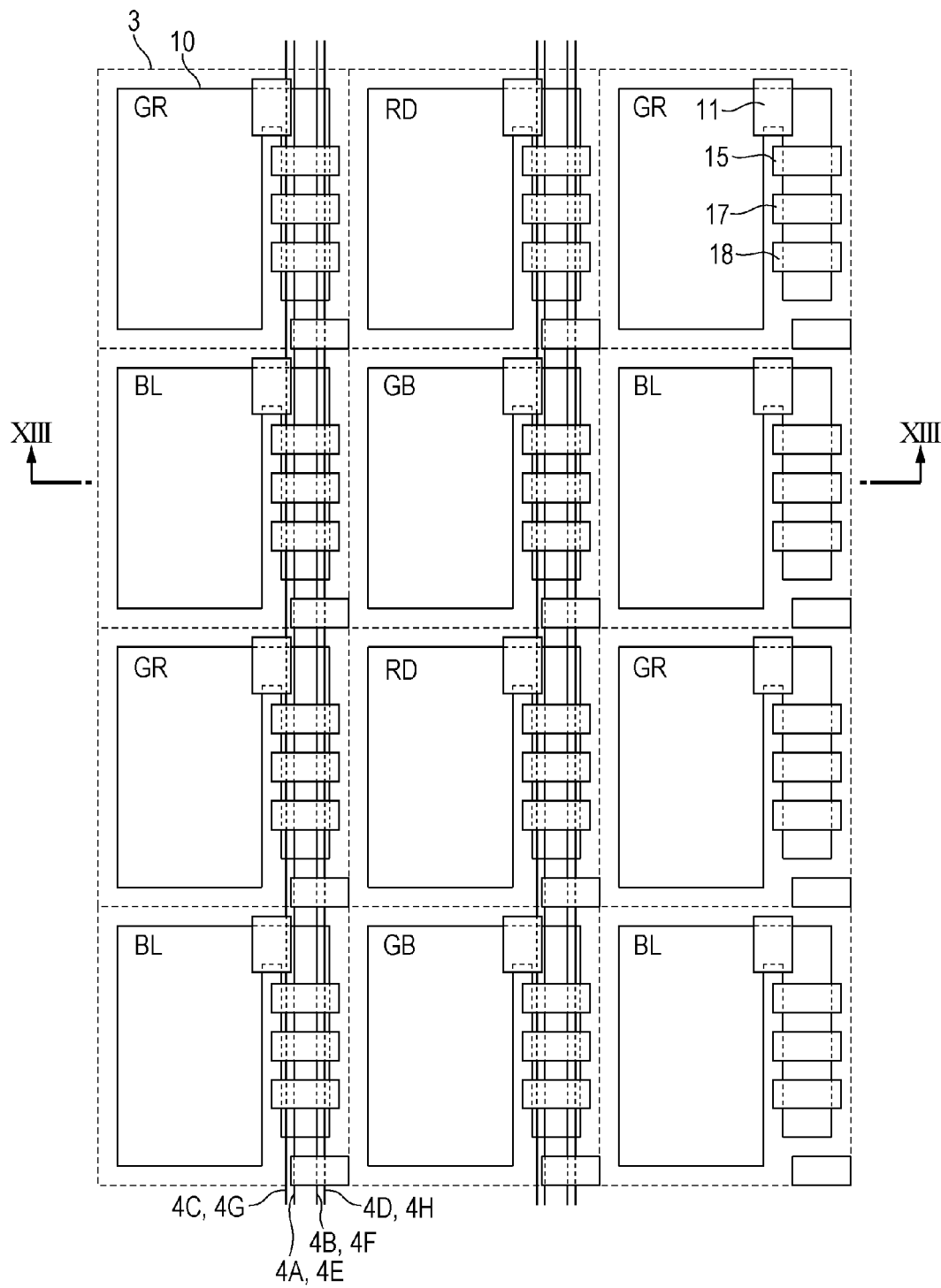
FIG. 12 is a diagram illustrating a pixel array according to a fourth embodiment.
Figure 13:
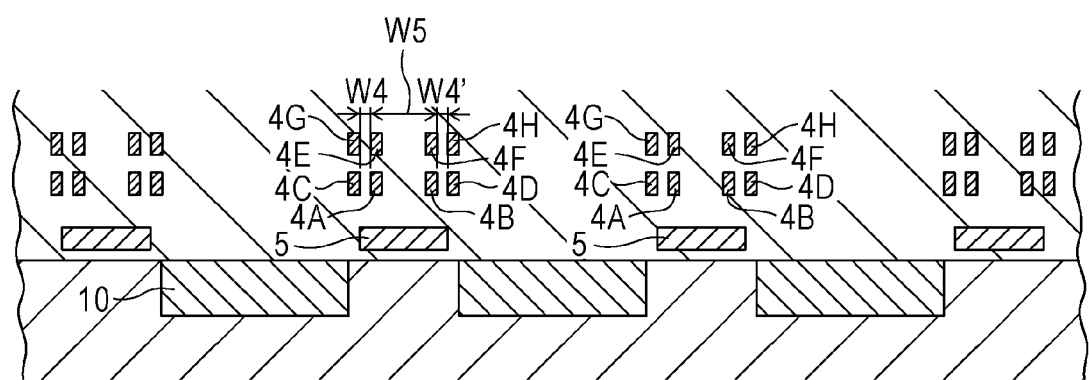
FIG. 13 is a sectional view of an image pickup device according to the fourth embodiment.

An image pickup device according to a fourth embodiment will be described with reference to FIGS. 12 and 13. FIG. 12 is a schematic plan view illustrating the pixels 3 (RD, BL, GR, and GB) arranged in four rows and three columns in the pixel portion 2 of the image pickup device according to the fourth embodiment. An illustration of the output terminals 20 and the power-supply terminals 21 and 22 is omitted. FIG. 13 schematically illustrates a sectional structure along line XIII-XIII illustrated in FIG. 12.

A difference between the fourth embodiment and the first to third embodiments is that column signal lines are disposed on different wiring layers. In the fourth embodiment, the image pickup device includes first to eighth column signal lines 4A to 4H. In the fourth embodiment, on another wiring layer, a distance (W5) between the fifth column signal line 4E and the sixth column signal line 4F is larger than a distance (W4) between the fifth column signal line 4E and the seventh column signal line 4G and larger than a distance (W4') between the sixth column signal line 4F and the eighth column signal line 4H. The distances W4 and W4' may be equal or different as long as they are smaller than the distance W5. The fourth embodiment enables a further increase in the read rate in the pixel portion 2 as the number of column signal lines is increased.

Fifth Embodiment

Figure 14:
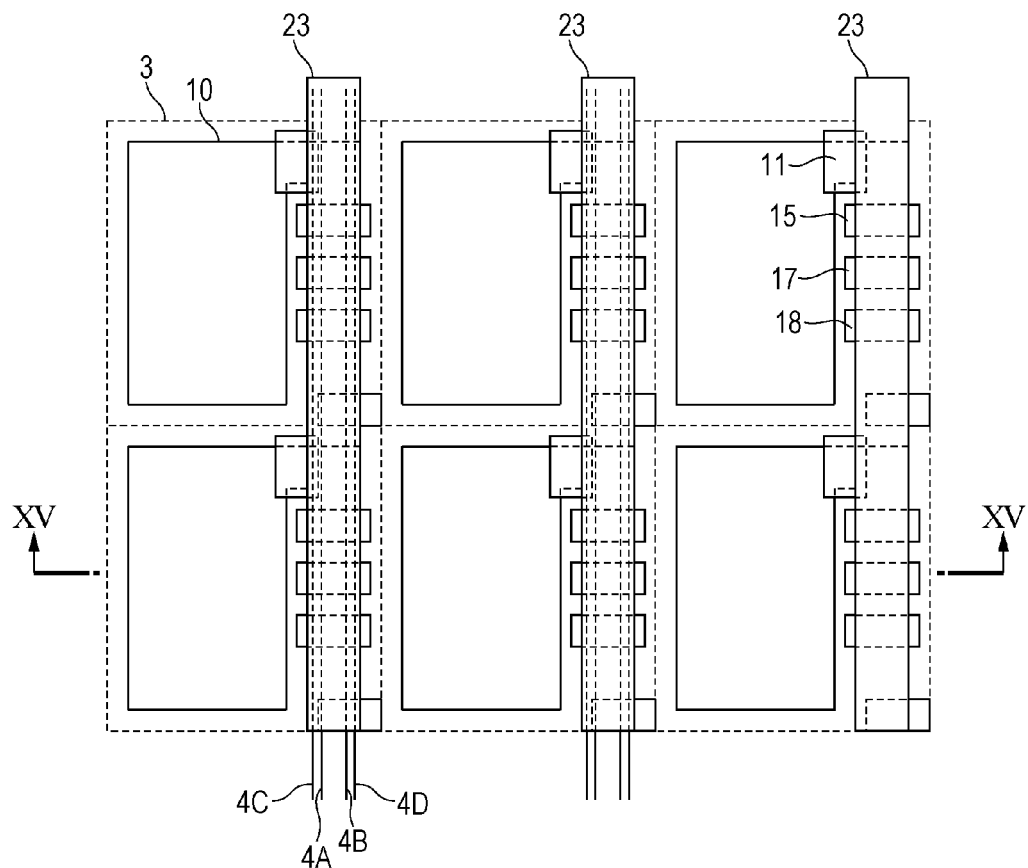
FIG. 14 is a diagram illustrating a pixel array according to a fifth embodiment.

An image pickup device according to the fifth embodiment will be described with reference to FIGS. 14 and 15. FIG. 14 is a schematic plan view illustrating the pixels 3 arranged in two rows and three columns in the pixel portion 2 according to the fifth embodiment.

Figure 15:
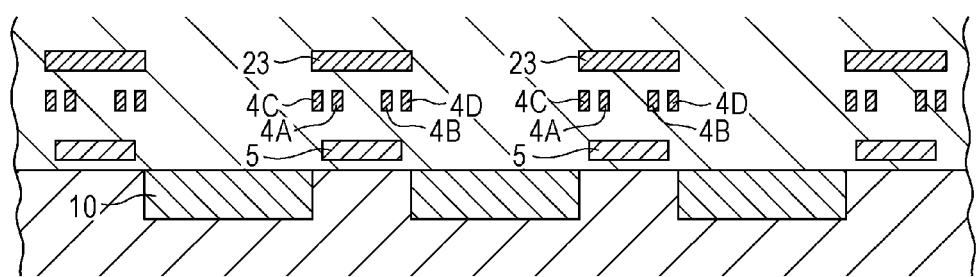
FIG. 15 is a sectional view of an image pickup device according to the fifth embodiment.

FIG. 15 schematically illustrates a sectional structure along line XV-XV in the schematic plan view of FIG. 14.

A difference between the fifth embodiment and the first to fourth embodiments is that a light-shielding portion is disposed on a layer different from the wiring layer(s) having the plurality of column signal lines disposed thereon and that the light-shielding portion is disposed such that the position of the light-shielding portion coincides with those of the plurality of column signal lines in plan view. A light-shielding layer 23 is desirably disposed at a position where it does not block light that is incident on the photoelectric converters 10 and is more desirably disposed above the floating diffusion 13 and the transistors of the pixels 3. Since the light-shielding layer 23 successfully decreases an amount of light that is incident on the floating diffusion 13 and the transistors of the pixels 3, it successfully decreases the influence of incident light on the pixel signals. In addition, the light-shielding layer 23 may also function as the power-supply lines 5 and 6.

Sixth Embodiment

Figure 16:
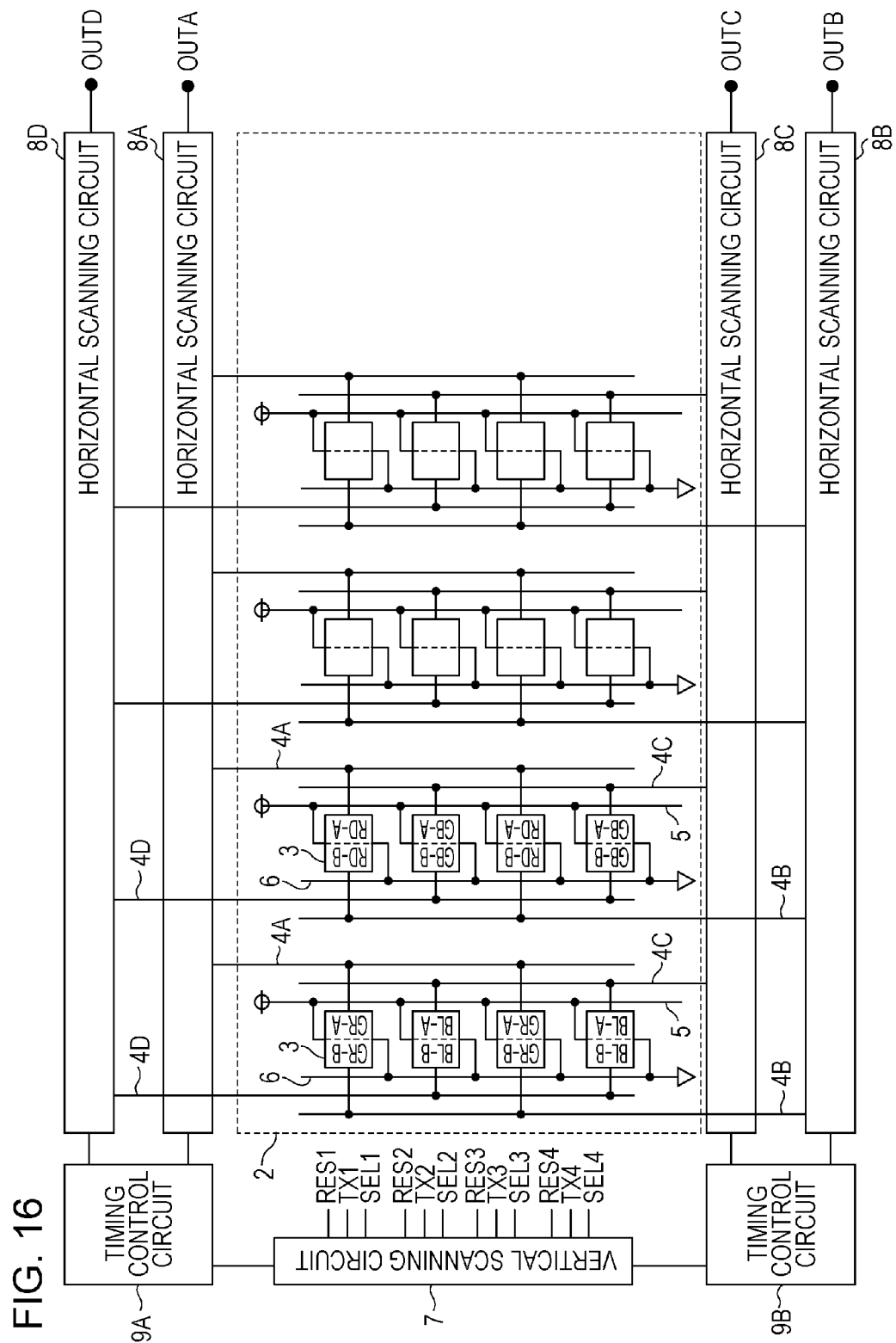
FIG. 16 is a schematic block diagram according to a sixth embodiment.

FIG. 16 is a block diagram illustrating a configuration according to a sixth embodiment. The sixth embodiment differs from the first to fifth embodiments in that each of the pixels 3 includes two photoelectric converters (first and second photoelectric converters). FIG. 9A is used as a schematic diagram illustrating a sectional structure according to the sixth embodiment.

Referring to FIG. 16, light is incident on the first photoelectric converter (GR-A, for example) and the second photoelectric converter (GR-B, for example) through a microlens disposed for the first and second photoelectric converters in common. The first and second photoelectric converters receive light that has passed different regions of the exit pupil of the microlens. Accordingly, signals read individually from the first and second photoelectric converters include a focus detection signal. That is, it is successfully determined whether an image is in focus on the basis of light intensity distributions detected by the first and second photoelectric converters.

On the first column of the pixel portion 2 illustrated in FIG. 16, a signal of the first photoelectric converter GR-A of the pixel 3 on the first row is output to the first column signal line 4A, and a signal of the second photoelectric converter GR-B of the pixel 3 on the first row is output to the second column signal line 4B. In addition, a signal of the first photoelectric converter BL-A of the pixel 3 on the second row is output to the third column signal line 4C, and a signal of the second photoelectric converter BL-B of the pixel 3 on the second row is output to the fourth column signal line 4D. The parasitic capacitances on the first and second column signal lines 4A and 4B are successfully decreased by disposing the first to fourth column signal lines 4A to 4D in a manner as described in each of the first to fifth embodiments. Since a difference in the parasitic capacitance between the first and second column signal lines 4A and 4B and the third and fourth column signal lines 4C and 4D is consequently decreased, and a difference in the signal transfer delay between the column signal lines is successfully decreased.

In the sixth embodiment, both the column signal lines (the first and second column signal lines 4A and 4B) that transfer signals from the first and second photoelectric converters GR-A and GR-B for an identical color have a parasitic capacitance of CL5+CL6. In addition, both the column signal lines (the third and fourth column signal lines 4C and 4D) that transfer signals from the first and second photoelectric converters BL-A and BL-B for an identical color have a parasitic capacitance of CL5. Since a difference in the parasitic capacitance between the column signal lines for an identical color is decreased, such a configuration successfully equalizes the noise level on the column signal lines for the identical color and successfully enhances the effect of noise processing in the subsequent signal processing.

In addition, each of the pixels 3 may have floating diffusions respectively for the first and second photoelectric converters, or one floating diffusion may be shared by the first and second photoelectric converters. In the case where a floating diffusion is shared by two photoelectric converters in a focus detection pixel, one signal line is provided for a pixel. Accordingly, the arrangement of lines described with reference to FIGS. 7 to 9A in the second embodiment may be used.

Other Embodiments

The first to sixth embodiments described above may be combined with one another. In addition, the first to sixth embodiments described above are applicable to not only CMOS image pickup devices but also charge coupled device (CCD) image pickup devises. Further, the image pickup device included in a camera (image capturing apparatus) has been described above. The concept of the camera (image capturing apparatus) encompasses not only devices intended mainly for image capturing but also devices additionally having an image capturing function (e.g., personal computers and mobile terminals). A camera (image capturing apparatus) may include the image pickup device according to an aspect of the present invention that has been described as the first to sixth embodiments above and a processing unit configured to process a signal output from this image pickup device. The processing unit may include, for example, an A/D converter and a processor configured to process digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-074499, filed Mar. 31, 2015, which is hereby incorporated by reference herein in its entirety.

What is claimed is:
1. An image pickup device comprising:
a photoelectric converter;
an amplifier configured to output a pixel signal, which is based on signal charge accumulated in the photoelectric converter, to a first signal line and a second signal line different from the first signal line; and
a first wiring layer on which the first signal line, the second signal line, a first line different from the first signal line and the second signal line, and a second line different from the first signal line, the second signal line, and the first line are disposed in an identical direction,
wherein the first signal line is disposed between the first line and the second signal line in plan view and the second signal line is disposed between the first signal line and the second line in plan view,
wherein a distance between the first signal line and the second signal line is larger than a distance between the first signal line and the first line or larger than a distance between the second signal line and the second line,
wherein the distance between the first signal line and the second signal line is smaller than a width of the photoelectric converter, and
wherein the first signal line and the second signal line do not have any line therebetween.

2. The image pickup device according to claim 1, wherein $$\frac{L}{2} < X < 2L(\sqrt{2} - 1) - \frac{L}{2}$$

is satisfied, where
X denotes a value obtained by dividing the distance between the first signal line and the second signal line by 2, and
L denotes a distance between a position of the first line and a midpoint between a position of the first signal line and a position of the second signal line.

3. The image pickup device according to claim 1, wherein the first signal line is a sole line adjacent to the first line, and the second signal line is a sole line adjacent to the second line.

4. The image pickup device according to claim 1, wherein the first signal line and the first line do not have any line therebetween, and the second signal line and the second line do not have any line therebetween.

5. The image pickup device according to claim 1, wherein on the first wiring layer, a plurality of lines including the first signal line, the second signal line, the first line, and the second line are disposed, and
wherein the distance between the first signal line and the first line or the distance between the second signal line and the second line is the smallest among distances between the plurality of lines on the first wiring layer.

6. The image pickup device according to claim 1, wherein each of the first line and the second line is a power-supply line.

7. An image pickup device comprising:
a photoelectric converter;
an amplifier configured to output a pixel signal, which is based on signal charge accumulated in the photoelectric converter, to a first signal line and a second signal line different from the first signal line; and
a first wiring layer on which the first signal line, the second signal line, a first line different from the first signal line and the second signal line, and a second line different from the first signal line, the second signal line, and the first line are disposed in an identical direction,
wherein the first signal line is disposed between the first line and the second signal line in plan view and the second signal line is disposed between the first signal line and the second line in plan view,
wherein a distance between the first signal line and the second signal line is larger than a distance between the first signal line and the first line or larger than a distance between the second signal line and the second line,
wherein the distance between the first signal line and the second signal line is smaller than a width of the photoelectric converter,
wherein the first line is a third signal line to which a pixel signal that is based on the signal charge accumulated in the photoelectric converter is output, and
wherein the second line is a fourth signal line to which a pixel signal that is based on the signal charge accumulated in the photoelectric converter is output.

8. The image pickup device according to claim 7, wherein the first signal line and the third signal line transfer the pixel signals for an identical color.

9. The image pickup device according to claim 7, wherein the first signal line and the second signal line transfer the pixel signals for an identical color.

10. The image pickup device according to claim 7, further comprising
a second wiring layer different from the first wiring layer on which the first signal line, the second signal line, the third signal line, and the fourth signal line are disposed,
wherein a power-supply line is disposed on the second wiring layer.

11. The image pickup device according to claim 7, wherein the photoelectric converter includes a first photoelectric converter and a second photoelectric converter,
wherein the image pickup device further comprises
a microlens provided in common for the first photoelectric converter and the second photoelectric converter, and
wherein a signal of the first photoelectric converter and a signal of the second photoelectric converter are separately readable from the first photoelectric converter and the second photoelectric converter.

12. The image pickup device according to claim 11, wherein a pixel signal that is based on signal charge accumulated in the first photoelectric converter is output to the first signal line, and
wherein a pixel signal that is based on signal charge accumulated in the second photoelectric converter is output to the second signal line.

13. The image pickup device according to claim 11, wherein a pixel signal that is based on signal charge accumulated in the first photoelectric converter and a pixel signal that is based on signal charge accumulated in the second photoelectric converter are output to the first signal line.

14. An image pickup device comprising:
a photoelectric converter;
an amplifier configured to output a pixel signal, which is based on signal charge accumulated in the photoelectric converter, to a first signal line and a second signal line different from the first signal line; and
a first wiring layer on which the first signal line, the second signal line, a first line different from the first signal line and the second signal line, and a second line different from the first signal line, the second signal line, and the first line are disposed in an identical direction,
wherein the first signal line is disposed between the first line and the second signal line in plan view and the second signal line is disposed between the first signal line and the second line in plan view,
wherein a distance between the first signal line and the second signal line is larger than a distance between the first signal line and the first line or larger than a distance between the second signal line and the second line,
wherein the distance between the first signal line and the second signal line is smaller than a width of the photoelectric converter,
wherein the amplifier includes a first amplifier and a second amplifier,
wherein the first amplifier outputs the pixel signal to the first signal line, and
wherein the second amplifier outputs the pixel signal to the second signal line.

15. An image capturing apparatus comprising:
the image pickup device according to claim 1; and
a processing unit configured to process a signal output from the image pickup device.

* * * * *